United States Patent [19]

Karczewski

[11] Patent Number: 5,059,926

[45] Date of Patent: Oct. 22, 1991

[54] FREQUENCY SYNCHRONIZATION APPARATUS

[75] Inventor: Casimir Karczewski, Lake Villa, Ill.

[73] Assignee: Motorola, Inc., Schaumburg, Ill.

[21] Appl. No.: 668,575

[22] Filed: Mar. 13, 1991

[51] Int. Cl.$^5$ .......................... H03L 7/00; H03L 7/06
[52] U.S. Cl. ......................................... 331/47; 331/2; 331/18; 331/55; 331/172
[58] Field of Search ........................ 331/1 A, 2, 14, 18, 331/25, 44, 47, 55, 172

[56] References Cited

U.S. PATENT DOCUMENTS

| | | | |
|---|---|---|---|
| 4,282,493 | 8/1981 | Moreau | 331/55 X |
| 4,305,045 | 12/1981 | Metz et al. | 331/1 A |
| 4,450,518 | 5/1984 | Klee | 331/1 AX |
| 4,458,214 | 7/1984 | Lakomy | 331/1 A |
| 4,550,292 | 10/1985 | Smith | 331/2 |
| 4,598,257 | 7/1986 | Southard | 331/55 X |

*Primary Examiner*—David Mis
*Attorney, Agent, or Firm*—Wayne J. Egan

[57] ABSTRACT

This invention provides an improved method for synchronizing a slave oscillator with a master oscillator. The slave includes two counters designated Reference and System, driven by its oscillator; the master includes a System Counter driven by its oscillator. The master sends a reset signal to the slave, simultaneously resetting its System Counter. Periodically, the master sends to the slave a synchronization signal, which signal is generated at predetermined intervals based upon the master's System Counter. Upon receipt of the reset signal, the slave resets its counters. Later, upon receipt of the synchronization pulse, the slave modifies the value of its System counter based upon the closest multiple of the expected count value for the synchronization signal interval. The Reference Counter is not synchronized and runs free. At each synchronization signal, the slave compares its System Counter and Reference Counter to compute an oscillator error thus:

$$\text{Oscillator Error} = \frac{\text{Reference Counter value} - \text{System Counter value}}{\text{SystemCounter value}}.$$

The slave stores this value and, depending on its mode of operation, uses it warp its own oscillator.

13 Claims, 1 Drawing Sheet

FREQUENCY SYNCHRONIZATION APPARATUS

TECHNICAL FIELD

This application relates to a method and apparatus for synchronizing oscillators in slave sites with a master oscillator located at a master site.

BACKGROUND OF THE INVENTION

In a simulcast network, exact frequency synchronization of the various transmitters is required. This requirement often exceeds even the capabilities of ultra high-stability temperature-regulated reference oscillators commonly used in such applications. To maintain the required degree of synchronization, periodic manual measurement and adjustment is required.

SUMMARY OF THE INVENTION

The invention provides an improved method and apparatus for measuring the frequency difference of a slave oscillator compared to a master oscillator and manually or automatically synchronizing the slave to the master. The slave is arranged with two counters (a Reference Counter and a System Counter) driven by the slave oscillator; and the master is arranged with a master System Counter driven by the master oscillator.

According to the invention, the master sends a RESET signal to the slave and simultaneously resets its counter to zero. The master then sends a synchronization signal to the slave on a predetermined periodic basis. As for the slave, upon receipt of the RESET signal, it resets both of its counters to zero. Later, upon receipt of the synchronization signal, the slave modifies its System Counter to a value which is the closet multiple of the expected counter value for the synchronization signal interval. The Reference Counter is allowed to free run and is not synchronized. After a synchronization signal is received, the slave compares its System Counter and Reference Counter to determine any count difference. This difference is the oscillator error and is computed using the following equation:

$$\text{Oscillator Error} = \frac{\text{Reference Counter value} - \text{System Counter value}}{\text{System Counter value}}.$$

The error is stored in the error register.

Two measurement modes (One Time Measurement or Cumulative Measurement) and two adjustment modes (Manual Adjustment and Automatic Adjustment) are available to the slave.

Mode M1 is the One-Time Measurement mode where the error measurement is performed within one synchronization signal interval. At the end of the interval the error is calculated and stored, the counters are reset and another measurement cycle is started. Since the error measurement is performed within one synchronization signal interval, the System Counter value will be the expected counter value for that synchronization signal interval. Therefore the oscillator error is computed using the following equation:

$$\text{Oscillator Error} = \frac{\text{Reference Counter value} - \text{expected counter value}}{\text{expected counter value}}.$$

Mode M2 is the Cumulative Measurement mode where the error measurement is performed over multiple synchronization signal intervals. At the end of each interval the error is calculated and stored but the counters are not reset. This error is calculated using the cumulative values in the counters which then requires less precision in the synchronization signal detection by the slave. Essentially, multiple samples (synchronization signal intervals) allow sloppier detection.

Mode A1 is the Manual Adjustment mode where the slave does not warp its oscillator unless instructed to by the master. This mode is useful when central control of the oscillator modification is required. The master reads the error value using the READ signal and decides the appropriate action to take based upon the error value. The master may then inform the slave to warp its oscillator based on the calculated error, using a WARP signal. If the slave warps its oscillator then it resets its counters and starts another measurement cycle.

Mode A2 is the Automatic Adjustment mode where the slave warps its own oscillator when ever the error value exceeds a predetermined threshold. If the slave warps its oscillator then it resets its counters and starts another measurement cycle.

Therefore, error measurements are performed in either the One-Time Measurement mode (M1) where the calculations are performed within one synchronization interval or the Cumulative Measurement mode (M2) where the the calculations are performed over multiple synchronization intervals. Oscillator Adjustments are performed in either the Manual Adjustment mode (A1) where the master requests the adjustment after reading the error value from the slave or the Automatic Adjustment mode (A2) where the slave automatically adjusts its oscillator when the error has exceeded a predetermined threshold. In either case, whenever the slave oscillator is adjusted then the slave counters are reset to zero and another measurement cycle is started.

DETAILED DESCRIPTION OF THE INVENTION

Figure 1:
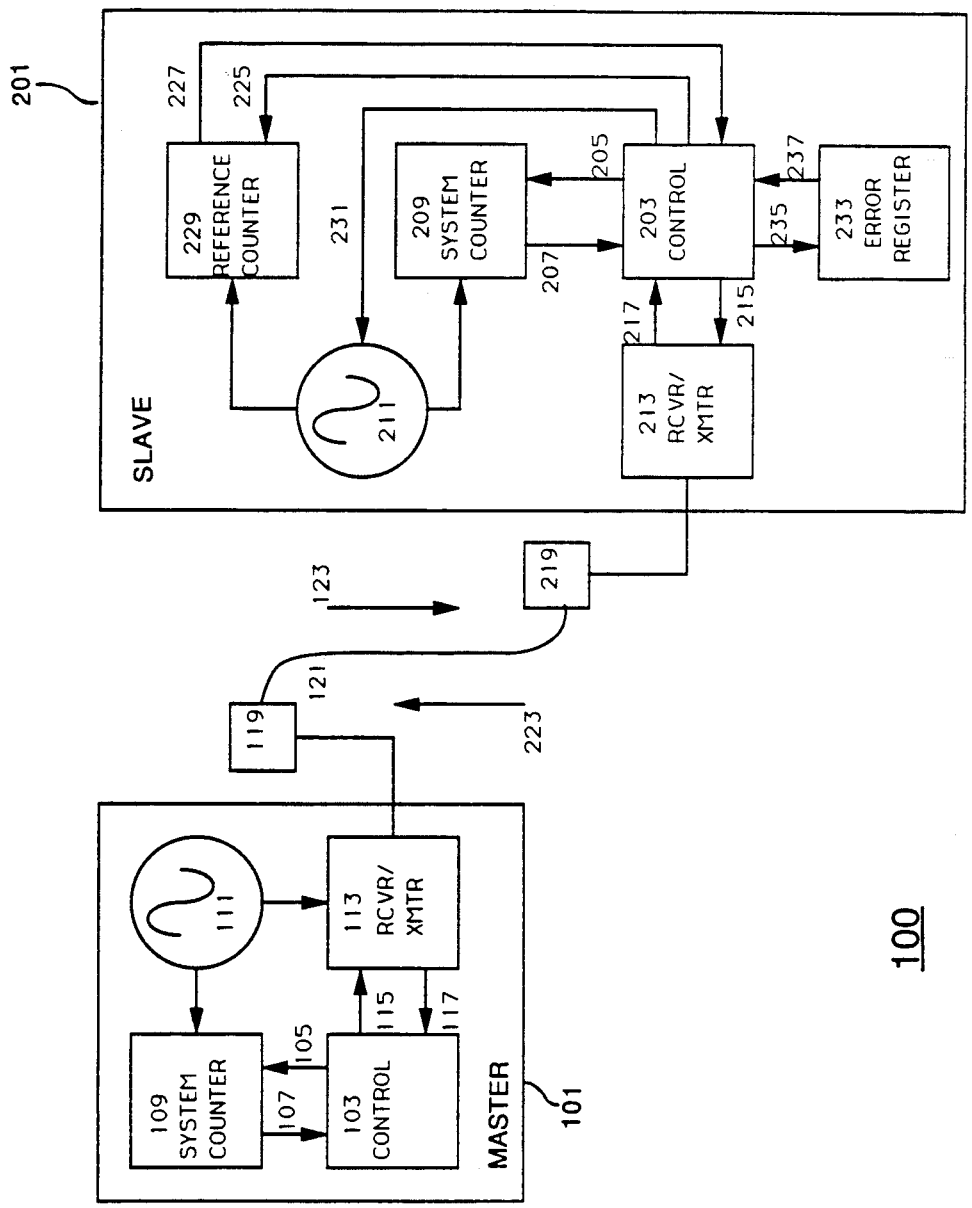
FIG. 1 is a block diagram that shows a first embodiment of a frequency synchronization apparatus, according to the invention.

Referring now to FIG. 1, there is shown a slave site 201 arranged to receive signals 123 from and transmit signals 223 to a master site 101 by means of a channel 121. The channel 121 may be, for instance, a radio communications link, telephone network, satellite link or a direct connection using wiring cables.

Referring now to the master site 101, there is shown a first oscillator 111 coupled to a first counter 109. There is also shown a controller 103. The first controller 103 may comprise, for instance, a suitably-programmed computer, microprocessor, or Digital Signal Processor (DSP). The controller 103 is arranged to control the counter 109 by means of control path 105 and 107. Such control will include issuing the RESET and READ signals. Also as shown, the controller 103 is coupled to receiver/transmitter 113 by means of paths 115 and 117. The receiver/transmitter 113 is arranged to apply signals 123 to and receive signals 223 from the channel 121 via the channel connection device 119.

Referring now to the slave site 201, there is shown a second oscillator 211 coupled to a second counter 209 and a third counter 229. There is also shown a channel connection device 219 couped to a receiver/transmitter 213 which, in turn, is coupled to a second controller 203 via paths 215 and 217. The controller 203 may comprise, for instance, a suitably-programmed computer, microprocessor, or Digital Signal Processor (DSP). The controller 203 is arranged to control the counters 209 and 229 by means of a control paths 205, 207, 225 and 227. Such control will include issuing the RESET, READ and MODIFY signals. The controller 203 is also arranged to control error register 233 via paths 235 and 237 and control oscillator 211 via path 231.

Those skilled in the art will appreciate that the goal of the invention is to equalize the oscillator 211 in the slave site 201—and the oscillators in all similar slave sites—to the same frequency as the oscillator 111 in the master site 101. It will be appreciated that the master site 101 has outbound signal paths to all slave sites 201 in the system, which may carry control traffic in the form of packetized messages or special tones. A typical protocol for this purpose might be, for instance, the MDC-1200 protocol.

To start the synchronization operation, the master site controller 103 causes the receiver/transmitter 113 to send a RESET signal to the slave site 201 via channel 121. At the same time, controller 103 causes the counter 109 to reset to zero, and then to begin counting responsive to oscillator 111. It will be appreciated that this RESET signal may, for instance, be imbedded into a message packet or be a special synchronization signal.

At the slave site 201, the receiver/transmitter 213 couples the RESET signal to the controller 203 via path 217. Upon receipt of the signal, controller 203 causes the counters 209 and 229 to reset to zero, and then to begin counting responsive to oscillator 211.

Periodically, the master site controller 103 causes the transmitter 113 to send a synchronization signal, either a packetized message or special tones, to the slave site 201 via channel 121. The signal is transmitted at predetermined intervals based upon the counter 109.

At the slave site 201, the receiver/transmitter 213 couples the synchronization signal to the controller 203 via path 217. Upon receipt of the signal, controller 203 reads the value of the counter 209 via path 207. The value is modified, to equal the closest whole number multiple of the expected count value for the given synchronization interval, using the MODIFY signal via path 205. The controller 203 also reads the value of the counter 229 via path 227 computes the error of its own oscillator 211 relative to that of the master site 101 oscillator 111 as:

$$\text{Error Value} = \frac{\text{counter 229 value} - \text{counter 209 value}}{\text{counter 209 value}}.$$

The controller 203 stores the error value in the error register 233 via path 235.

Depending upon the slave mode, the controller 203 may then warp its own oscillator 211 via path 231 to correct it using the formula:

New oscillator frequency = Old oscillator frequency × (1 − Error value).

Thus, if the counter 229 value is less than the counter 209 value, then the controller 203 will increase the frequency of oscillator 211 by the amount of the error. Otherwise, if the counter 229 value is greater than the counter 209 value, then the controller 203 will decrease the frequency of oscillator 211 by a like amount.

The controller 103 may read the error value using a READ signal issued via the channel 121 to the controller 203. The controller 203 will in turn read the value of the error register 233 via path 237 and send back the value via channel 121 to the controller 103. The controller 103 may then signal the slave to warp its oscillator using a WARP signal via channel 121 to the controller 203. The controller 203 will warp its own oscillator 211 via path 231 to correct it using the value stored in the error register or using the value contained within the WARP signal.

Whenever the controller 203 warps its oscillator 211, it will reset counter 209 via path 205 and counter 229 via path 225 to zero and start a new measurement cycle.

When applied in a radio communication system, the invention provides for a simple method of allowing several base stations to synchronize their oscillators, based on special signals and the synchronization signal, to the controller's oscillator, without necessitating the return path for station status back to the controller. The invention also allows for full master control of the slave oscillator synchronization if the return path is utilized. In the automatic adjustment mode, this invention takes a great deal of load off of the master and reduces traffic on all control paths. As the method does not tie up the channel for a substantial amount of time, as prior art methods do, the user perceives a performance improvement. Furthermore, since continuous equalization is possible, less expensive, lower stability oscillators can be used. The invention thus makes up for the lower stability with constant measurements and readjustments.

It will be apparent that the accuracy that can be obtained is limited only by the resolution of the counters and the duration of the operation.

One skilled in the art will appreciate that the frequency synchronization apparatus and method, according to the present invention, provides a substantial advantage over the prior art. The closest technology is the present manual synchronization system. In this system, a service man visits each site and zero beats a base station's carrier frequency with that of another base station at a site in the overlap area. This is accomplished by using the site transmit antenna to receive the unmodulated RF from the keyed station at the remote site. This signal is mixed with a low level output from the on-site station, and the service man tunes the on-site station's oscillator for the zero beat note. Both stations are removed from the system during the equalization as well as disrupting any other transmission activity on that channel. This process must be repeated for all stations in the system.

A first example follows. This invention, for example, is planned to be used in the Motorola Paging Universal Remote Control system which is a paging system which may operate, for example, at 928 MHz (Channel 121=928 MHz). In this typical system, oscillator 111 located in the Paging Controller (Master 101) is a 8.2 MHz high stability (5 ppb) oscillator. Oscillator 211 located in the Paging Base Station (Slave 201) is a 5.0 MHz high stability (30 ppb) oscillator.

A second example follows. In one application it has been predetermined that the Paging Controller will send synchronization signals on 24 hour intervals relative to counter 109. The base station is operating in measurement mode M1 and adjustment mode A1 and is expecting to receive these synchronization signals on 24 hours intervals. It will not adjust its oscillator but only store the calculated error value. Therefore to start the process the Paging Controller sends a RESET signal to the base station. Upon receiving the RESET signal the base station resets counters 209 and 229.

After 24 hours the Paging Controller sends a synchronization signal to the base station at which time it modifies counter 209 to the expected counter value of 432,000,000,000 (5,000,000 counts/second×3600 seconds/hour×24 hours) for the 24 hour interval. Then the error is computed between the value in counters 229 and 209 and stored in the error register. If the counter 229 value was 432,000,012,960, for instance, then the error is calculated to be (432,000,012,960−432,000,000,000)/432,000,000,000=-0.000,000,000,030 (+30 ppb). The frequency of oscillator 211 is adjusted to be f=f×(1−0.000,000,000,030). The base station resets counters 229 and 209 and waits for the next synchronization signal.

The Paging Controller may now read the error value from the error register in the base station using a READ signal and, based on the error value sent by the base station, decide if an adjustment is required. If it is then a WARP signal is sent to the base station and the base station warps its oscillator based upon the warp amount sent by the Paging Controller or by the error value stored in the error register.

A third example follows. In another application it has been predetermined that the Paging Controller will send synchronization signals on 24 hour intervals relative to counter 109. The base station is operating in measurement mode M1 and adjustment mode A2 and is expecting to receive these synchronization signals on 24 hours intervals and it will adjust its oscillator 211 if the calculated error exceeds a predetermined threshold. Therefore to start the process the Paging Controller sends a RESET signal. Upon receiving the RESET signal the base station resets counters 209 and 229.

After 24 hours the Paging Controller sends a synchronization signal to the base station at which time it modifies counter 209 to the expected counter value of 432,000,000,000 (5,000,000 counts/second×3600 seconds/hour×24 hours) for the 24 hour interval. Then the error is computed between the value in counters 229 and 209 and stored in the error register. If the counter 229 value was 432,000,012,960, for instance, then the error is calculated to be (432,000,012,960−432,000,000,000)/432,000,000,000=-0.000,000,000,030 (+30 ppb). If this error is above the threshold then the frequency of oscillator 211 is adjusted to be f=f×(1−0.000,000,000,030). The base station resets counters 229 and 209 and waits for the next synchronization signal.

A fourth example follows. In another application it has been predetermined that the Paging Controller will send the synchronization signal on 1 hour intervals relative to counter 109. The base station is operating in measurement mode M2 and adjustment mode A2 and is expecting to receive the synchronization signal on 1 hours intervals and it will adjust oscillator 211 if the calculated error exceeds a predetermined threshold. Therefore to start the process the Paging Controller sends a RESET signal to the base station. Upon receiving the RESET signal the base station resets counters 229 and 209.

Every hour the Paging Controller sends another synchronization signal to the base station at which time it adjusts counter 209 to be an even multiple of a expected counter value for the one hour interval. One hour intervals produce a count value of 18,000,000,000. Counter 229 is allowed to free run and is not adjusted.

Upon receiving the synchronization signal, the accumulated error is calculated using the formula: (Counter 229−Counter 209)/Counter 209. If this error is above a predetermined level then the oscillator 211 is adjusted. After 24 hours, i.e. 24 additional synchronization signals, counter 209 will contain 432,000,000,000 and counter 229 may, for instance, contain 432,000,012,960. The error is calculated to be (432,000,012,960−432,000,000,000)/432,000,000,000=-0.000,000,000,030=+30 ppb. If this error is above the threshold then the frequency of oscillator 211 is adjusted to be f=f×(1−0.000,000,000,030) and the base station resets counters 229 and 209 and waits for the next synchronization signal.

While various embodiments of a frequency synchronization apparatus, according to the present invention, have been described hereinabove, the scope of the invention is defined by the following claims.

What is claimed is:

1. In a system comprising a master having a master oscillator of frequency $f_m$ and a master counter responsive to said master oscillator, said master coupled to a slave via a channel, said slave having a slave oscillator of frequency $f_s$ and a slave counter responsive to said slave oscillator, a method of adjusting said slave oscillator, comprising the steps of:

at said master:
  (a) sending a first signal to said slave;
  (b) after Δt has elapsed since sending said first signal as in master
step (a), sending a second signal to said slave, where Δt is predetermined;

at said slave:
  (a) receiving said first signal;
  (b) upon receiving said first signal, resetting said slave counter;
  (c) receiving said second signal;
  (d) upon receiving said second signal, determining the slave counter value;

(e) computing an error = $\frac{\text{slave counter value} - \delta}{\delta}$, where $\delta$ is equal to the expected slave counter value for Δt time;
  (f) adjusting $f_s = f_s (1 - \text{error})$.

2. The method of claim 1, wherein said channel is a radio frequency link.

3. The method of claim 1, wherein said first signal and said second signal comprise message packets.

4. In a system comprising a master having a master oscillator of frequency $f_m$ and a counter response to said master oscillator, said master coupled to a slave via a channel, said slave having a slave oscillator of frequency $f_s$ and a slave counter responsive to said slave oscillator, a method of adjusting said slave oscillator, comprising the steps of:

at said master:
  (a) sending a first signal to said slave;
  (b) after Δt has elapsed since sending said first signal as in master
step (a), sending a second signal to said slave, where Δt is predetermined;
  (c) sending a READ signal to said slave;
  (d) receiving a ERROR signal from said slave;
  (e) sending a WARP signal to said slave;
at said slave:

(a) receiving said first signal;
(b) upon receiving said first signal, resetting said slave counter;
(c) receiving said second signal;
(d) upon receiving said second signal, determining the slave counter value;

(e) computing an error = $\frac{\text{slave counter value} - \delta}{\delta}$, where $\delta$ is equal to the expected slave counter value for $\Delta t$ time;

(f) store said error value;
(g) receiving said READ signal;
(h) upon receiving said READ signal, sending said ERROR signal to said master;
(i) receiving said WARP signal;
(h) upon receiving said WARP signal, adjusting $f_s = f_s (1 - \text{error})$.

5. The method of claim 4, wherein said channel is a radio frequency link.

6. In a system comprising a master having an oscillator of frequency $f_m$ and a counter response to said oscillator, coupled to a slave via a channel, said slave having an oscillator of frequency $f_s$ and counters A and B responsive to said oscillator, a method of adjusting said slave oscillator, comprising the steps of:
at said master:
  (a) sending a first signal to said slave;
  (b) after $\Delta t$ has elapsed since sending said first signal as in master step (a), sending a second signal to said slave, where $\Delta t$ is predetermined;
at said slave:
  (a) receiving said first signal;
  (b) upon receiving said first signal, resetting said counters A and B;
  (c) receiving said second signal;
  (d) upon receiving said second signal, determining the counter B value;
  (e) upon receiving said second signal, modifying the counter A value to be equal to $\delta$, where $\delta$ is the expected counter value for $\Delta t$ time;

(f) computing an error = $\frac{\text{counter } B \text{ value} - \text{counter } A \text{ value}}{\text{counter } A \text{ value}}$;

(g) adjusting $f_s = f_s (1 - \text{error})$.

7. The method of claim 6, wherein said channel is a radio frequency link.

8. The method of claim 6, wherein said first signal and said second signal comprise message packets.

9. In a system comprising a master having a master oscillator of frequency $f_m$ and a master counter responsive to said master oscillator, said master coupled to a slave via a channel, said slave having a slave oscillator of frequency $f_s$ and counters A and B responsive to said slave oscillator, a method of adjusting said slave oscillator, comprising the steps of:
at said master:
  (a) sending a first signal to said slave;
  (b) after $\Delta t$ has elapsed since sending said first signal as in master step (a), sending a second signal to said slave, where $\Delta t$ is predetermined;
  (c) periodically sending subsequent signals (third, fourth, etc.) at $\Delta t$ intervals;
at said slave:
  (a) receiving said first signal;
  (b) upon receiving said first signal, resetting said counters A and B;
  (c) receiving said second signal;
  (d) upon receiving said second signal, determining the counter B value;
  (e) upon receiving said second signal, modify the counter a value to be equal to the closest whole multiple of $\delta$, where $\delta$ is the expected counter value for $\Delta t$ time;

(f) computing a first error =

$\frac{\text{counter } B \text{ value} - \text{counter } A \text{ value}}{\text{counter } A \text{ value}}$;

(g) when said first error exceeds a predetermined threshold, then adjusting $f_s = f_s (1 - \text{first error})$ and repeating slave steps (a) through (g);
  (h) periodically receiving said subsequent (third, fourth, etc) signals;
  (i) upon periodically receiving said subsequent signals (third, fourth, etc), determining the counter B value, and modifying the counter A value to be equal to the closest whole multiple of $\delta$;

(j) computing a second error =

$\frac{\text{counter } B \text{ value} - \text{counter } A \text{ value}}{\text{counter } A \text{ value}}$;

(k) when said second error exceeds a predetermined threshold, then adjusting $f_s = f_s (1 - \text{second error})$ and repeat, beginning with slave step (a), otherwise repeat, beginning with slave step (h).

10. The method of claim 9, wherein said channel is a radio frequency link.

11. In a system comprising a master having a master oscillator of frequency $f_m$ and a master counter responsive to said master oscillator, said master coupled to a slave via a channel, said slave having a slave oscillator of frequency $f_s$ and slave counters A and B responsive to said slave oscillator, a method of adjusting said slave oscillator, comprising the steps of:
at said master:
  (a) sending a first signal to said slave;
  (b) after $\Delta t$ has elapsed since sending said first signal as in master step (a), sending a second signal to said slave, where $\Delta t$ is predetermined;
  (c) periodically sending subsequent signals (third, fourth, etc) at $\Delta t$ intervals;
  (d) periodically sending a READ signal to said slave;
  (e) receiving a ERROR signal from said slave;
  (f) sending a WARP signal to said slave;
  (g) repeating master steps (c) through (g);
at said slave:
  (a) receiving said first signal;
  (b) upon receiving said first signal, resetting said counters A and B;
  (c) receiving said second signal;
  (d) upon receiving said second signal, determining the counter B value;
  (e) upon receiving said second signal, modifying the counter A value to be equal to the closest whole multiple of $\delta$, where $\delta$ is the expected counter value for $\Delta t$ time;

(f) computing a first error $= \dfrac{\text{counter } B \text{ value} - \text{counter } A \text{ value}}{\text{counter } A \text{ value}}$ (g) storing said first error value;
(h) periodically receiving said subsequent (third, fourth, etc.) signals;
(i) upon receiving a subsequent signal as in slave step (h), determining the counter B value, and modifying the counter A value to be equal to the closest whole multiple of δ;

(k) computing a second error =

$\dfrac{\text{counter } B \text{ value} - \text{counter } A \text{ value}}{\text{counter } A \text{ value}}$ ;

(l) storing said second error value;
(m) receiving said READ signal and, thereupon, sending an ERROR signal to master;
(o) receiving said WARP signal and, thereupon, adjusting $f_s = f_s (1 - \text{second error})$ and then repeating the process, beginning at slave step (a); and,
(q) repeating the process, beginning at slave step (h).

12. The method of claim 11, wherein said channel is a radio frequency link.

13. A master and a slave, said master having a master oscillator of frequency $f_m$ and a master counter responsive to said master oscillator, said master coupled to said slave via a channel, said slave having a slave oscillator of frequency $f_s$ and a slave counter responsive to said slave oscillator, said master arranged for:

(a) sending a first signal to said slave;
(b) after Δt has elapsed since sending said first signal as in master step (a), sending a second signal to said slave, where Δt is predetermined;

said slave arranged for adjusting said slave oscillator, according to a method comprising the following steps:

(a) receiving said first signal;
(b) upon receiving said first signal, resetting said slave counter;
(c) receiving said second signal;
(d) upon receiving said second signal, determining the slave counter value;

(e) computing an error $= \dfrac{\text{slave counter value} - \delta}{\delta}$ , where δ is equal to the expected slave counter value for Δt time;

(f) adjusting $f_s = f_s (1 - \text{error})$.

* * * * *

UNITED STATES PATENT AND TRADEMARK OFFICE
CERTIFICATE OF CORRECTION

PATENT NO. : 5,059,926
DATED : 10/22/91
INVENTOR(S) : Casimir Karczewski It is certified that error appears in the above-identified patent and that said Letters Patent is hereby corrected as shown below:

At column 8, line 7, "counter a value" should be
--counter A value--.

Signed and Sealed this

Sixteenth Day of March, 1993

Attest:

STEPHEN G. KUNIN

*Attesting Officer*     *Acting Commissioner of Patents and Trademarks*